(12) United States Patent
Lee et al.

(10) Patent No.: US 8,526,881 B2
(45) Date of Patent: Sep. 3, 2013

(54) MECHANICALLY ISOLATED WIRELESS COMMUNICATIONS SYSTEM AND METHOD

(75) Inventors: Donald B Lee, Shoreline, WA (US); Bradley J Mitchell, Snohomish, WA (US); Larry R Schultz, Bellevue, WA (US)

(73) Assignee: The Boeing Company, Chicago, IL (US)

( * ) Notice: Subject to any disclaimer, the term of this patent is extended or adjusted under 35 U.S.C. 154(b) by 1930 days.

(21) Appl. No.: 11/108,658

(22) Filed: Apr. 18, 2005

(65) Prior Publication Data

US 2006/0234787 A1   Oct. 19, 2006

(51) Int. Cl.
*H04B 7/00* (2006.01)

(52) U.S. Cl.
USPC ...................... 455/41.2; 455/575.1; 455/575.7

(58) Field of Classification Search
USPC .................................. 455/41.2, 575.1, 575.7
See application file for complete search history.

(56) References Cited

U.S. PATENT DOCUMENTS

| | | | |
|---|---|---|---|
| 5,093,890 A * | 3/1992 | Bregman et al. | ............... 385/146 |
| 5,128,689 A * | 7/1992 | Wong et al. | .................... 343/853 |
| 7,206,877 B1 * | 4/2007 | Doerenberg et al. | .......... 710/100 |
| 2004/0021564 A1 * | 2/2004 | Houston et al. | ............ 340/539.1 |

* cited by examiner

*Primary Examiner* — Edward Urban
*Assistant Examiner* — Hsin-Chun Liao
(74) *Attorney, Agent, or Firm* — Harness, Dickey & Pierce, P.L.C.

(57) ABSTRACT

A system and method for transmitting wireless energy between two or more components housed within a faraday-like cage structure. In one preferred form a cooling plenum of an equipment rack supporting a plurality of independent components is used for transmitting wireless signals between the components. In another form a wireless backplane is formed in an equipment rack that houses a plurality of LRUs. In another example a card file housing a plurality of components forms a faraday-like cage for enabling transmission of wireless signals, either electromagnetic wave or optical signals, between various circuit boards held within the card file. The various preferred embodiments eliminate the need for expensive, bulky and heavy electrical or optical cabling to be used to intercouple the components supported within the support structure for communication.

11 Claims, 3 Drawing Sheets

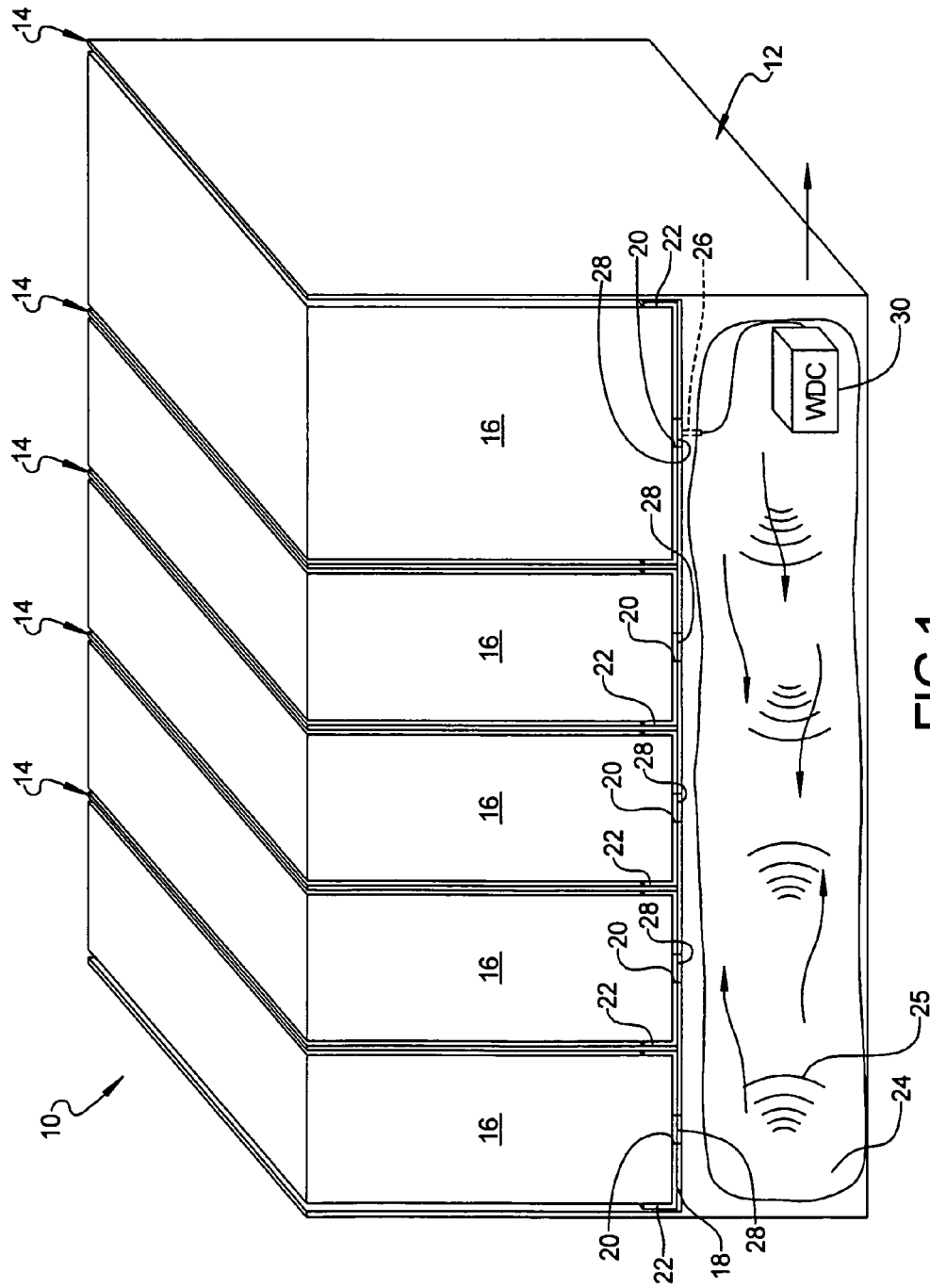

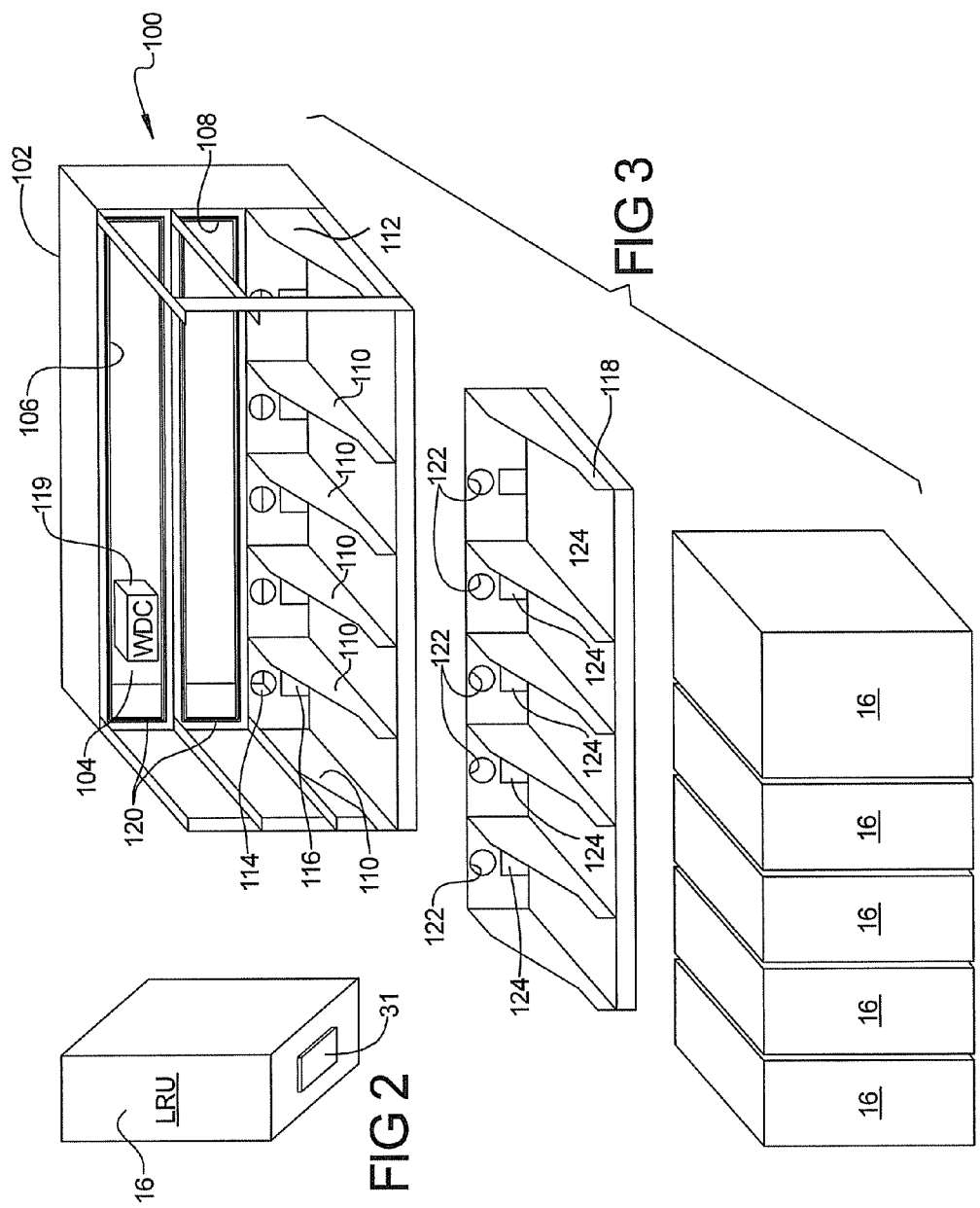

MECHANICALLY ISOLATED WIRELESS COMMUNICATIONS SYSTEM AND METHOD

FIELD

The present disclosure relates to wireless communications systems, and more particularly to a system and method for implementing wireless communications channels within an electronic equipment bay or other form of structure.

BACKGROUND

Many electronic systems, and particularly commercial aircraft avionics systems, require a highly reliable system interface that can support a plurality of electronic components, such as line replaceable units (LRUs), in a common equipment rack or shelf within an electronics equipment bay. However, this involves complex integration and wiring assemblies that increase overall system complexity and weight. In applications involving mobile platforms, the additional wiring, typically in the forms of wiring harnesses, connectors, etc., necessary to integrate a number of LRUs for communication with one another, can add up to significant weight. However, with many mobile platforms, and especially military and commercial aircraft, minimizing the overall weight of the mobile platform is an important consideration.

Accordingly, it would be highly desirable to provide a system and method for interfacing a plurality of LRUs or other forms of independent electrical or optical components in a manner such that the components can communicate with one another without the need for physical wiring being used to intercouple the components, that is, in wireless fashion. It would also be highly desirable to provide a system of easily intercoupling LRUs that increases overall system redundancy to thus further enhance the reliability of the electronics. Increased redundancy is especially desirable in mobile platform applications, and especially with airborne mobile platforms.

SUMMARY

The present disclosure is directed to an apparatus and method for channeling wireless energy between a plurality of independent components to enable communication between the components. In one embodiment an equipment bay is utilized for supporting a plurality of independent components adjacent one another. The plenum or backplane may form a cooling channel for also circulating a cooling air flow through the equipment bay. The equipment bay includes a plenum or a backplane area adjacent the components. The equipment bay, in one preferred form, may be formed from a material that impedes the transmission of electromagnetic wave energy, thus isolating the plenum or backplane area from electromagnetic wave energy present outside the equipment bay. The equipment bay also includes structure forming a plurality of openings that allow portions of each component to communicate with the plenum or backplane. Each component may include a wireless energy transmitter and/or receiver. Wireless energy is able to be transmitted through the plenum of backplane area between the components. This eliminates the need for wiring or wiring harnesses to be used to interconnect each of the components. In one preferred form the components may comprise line replaceable units (LRUs) or independent circuit boards. The wireless energy may comprise electromagnetic wave signals or optical signals.

In another preferred form a plurality of independent components are supported within a box-like enclosure. The enclosure may be made from a suitable material to prohibit the entry of electromagnetic waves and/or optical signals existing outside the enclosure from entering an interior area of the enclosure. Each of the components includes a wireless energy transmitter or receiver. The components are able to transmit wireless signals within the enclosure without being interconnected by physical wires or cables.

The present disclosure can be implemented at the printed circuit board level, the LRU level, at a tray and rack (system) level and at a equipment bay level, to provide various wireless transmitting/receiving capabilities between electronic and/or optical systems.

The various embodiments thus eliminate the need for heavy and often bulky electrical and/or optical cables to be used to electrically or optically couple independent component assemblies that are otherwise supported adjacent or in proximity with one another inside the structure. This in turn can significantly reduce the overall weight of an equipment bay or any form of subsystem in which two or more components need to communicate, and where physical wiring or optical cabling would otherwise be necessary for coupling the components for communication The features, functions, and advantages can be achieved independently in various embodiments of the present disclosures or may be combined in yet other embodiments.

BRIEF DESCRIPTION OF THE DRAWINGS

The present disclosure will become more fully understood from the detailed description and the accompanying drawings, wherein:

FIG. 1 is a simplified perspective view of an equipment shelf of an equipment bay incorporating a cooling plenum that also operates as a channel or waveguide area for propagating wireless energy between a plurality of LRUs being supported on the equipment tray;

FIG. 2 is a perspective view of an LRU incorporating a patch antenna, in accordance with an alternative preferred implementation of the invention;

FIG. 3 is an exploded perspective view of an equipment rack incorporating a wireless energy backplane;

DETAILED DESCRIPTION OF VARIOUS EMBODIMENTS

Figure 4:
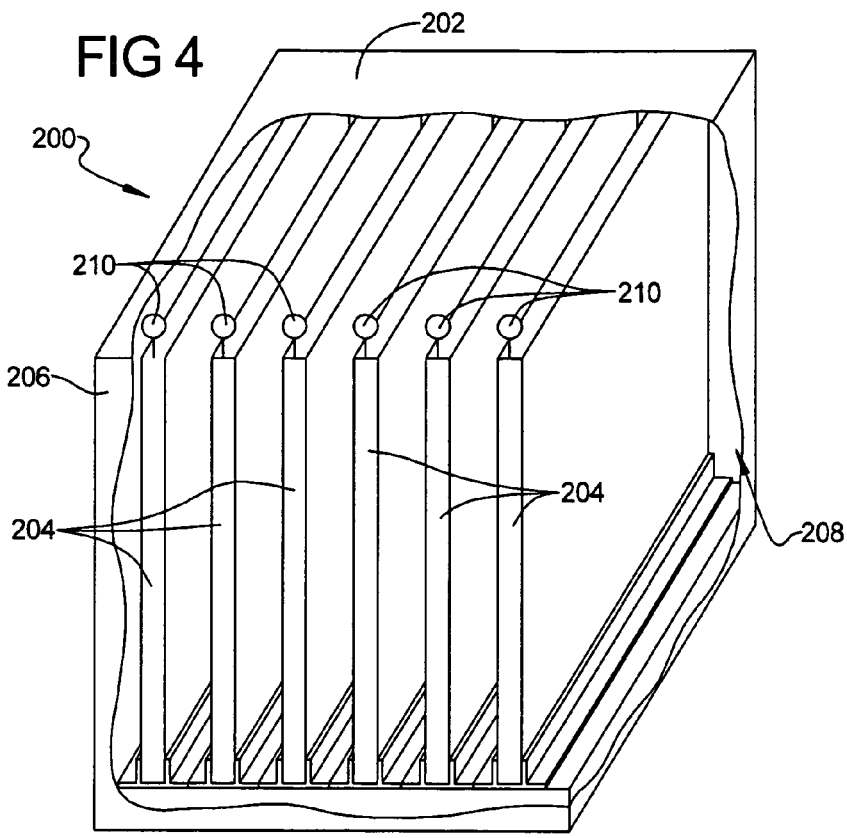
FIG. 4 is a perspective view of a card file for containing a plurality of the LRUs, wherein the interior area of the card file also is used to enable propagation of wireless energy between the LRUs.

The following description of the various embodiment(s) is merely exemplary in nature and is in no way intended to limit the disclosure, its application, or uses.

Referring to FIG. 1, there is shown an equipment shelf 10 in accordance with an embodiment of the present disclosure. The equipment shelf 10 includes a housing 12 forming a plurality of trays or slots 14 for accepting and supporting a corresponding plurality of line replaceable units (LRUs) 16. The housing 12 is preferably made from metal, and more preferably from aluminum, to act as an electromagnetic wave isolator to shield the LRUs from electromagnetic wave energy or optical energy present in the vicinity of the equipment tray 10.

The equipment tray 10 also includes a wall portion 18 having a plurality of openings 20. One or more RF mesh gaskets 22 may be included to form a seal around each opening 20 to further ensure that stray electromagnetic wave energy does not radiate into the housing 12 or out from the housing 12. The equipment tray 12 also includes a hollow cooling plenum 24 that forms an area or channel for circulating a cooling airflow in the vicinity of the LRUs 16 to cool the LRUs. In this instance, however, the cooling plenum 24 also forms a plenum for transmitting wireless energy 25 between the LRUs 16. The wireless energy may be in the form of electromagnetic wave signals or optical signals. If the wireless signals are optical signals, some form of optical coupling device, representative in highly simplified form by component 26, may be present on an LRU 16 to enable reception and/or transmission of optical signals to one or more of the other LRUs 16. If electromagnetic wave energy is being transmitted between the LRUs, then no such component protruding into the plenum 24 would be needed. A conventional airflow metering plate 28 may be disposed over each opening 20. Metering plates 28 may be formed from plastic and are used to regulate airflow that flows into each LRU 16.

The equipment shelf 10 thus eliminates the need for substantial wiring for interconnecting the LRUs 16. This represents a significant weight savings, as well as providing the benefit of increasing the redundancy of the overall system 10. By "redundancy", it is meant that multiple LRUs are able to use the same multi-access wireless bus and that equipment shelf designs can be reused in multiple applications. Additionally, individual LRUs 16 can be even more quickly removed and replaced, as well as upgraded if necessary, since the need for physically coupling each LRU to the other LRUs via wiring is eliminated.

In an alternative embodiment, the system 10 may incorporate a wireless data concentrator 30 disposed within the plenum 24. The wireless data concentrator (WDC) may be used to receive wireless signals propagating within the plenum 24 and to interface the signals to other equipment located remotely from the system 10. A suitable wireless data concentrator is available from Chipcon of Oslo, Norway.

If electromagnetic wave signals are being propagated within the plenum 24, such signals may be propagated over a wide frequency range. It is anticipated that in most instances, and particularly in commercial aircraft applications, wireless signals will be transmitted within a frequency range of between about 900 MHz -5 GHz. Various communication protocols may be used, for example the widely utilized 802.11 wireless protocol. In commercial aircraft applications the system 10 may form an ARINC 600 or ARINC 429 style equipment shelf. With brief reference to FIG. 2, each of the LRUs 16 may include a patch type antenna 31 positioned so as to overlay the opening 20 to optimize reception if electromagnetic wave signals are employed within the plenum 24. Wireless signals radiated from each of the LRUs 16 may vary significantly in power, but are expected in most applications to be in the milliwatt range.

Referring now to FIG. 3, a system 100 in accordance with an alternative embodiment of the disclosure is illustrated. System 100 forms an equipment rack for supporting a plurality of LRUs 16 and for providing a wireless energy backplane. The system 100 includes a housing 102 having a hollow backplane area 104. In this example, a pair of rectangular openings 106 and 108 provide access to the backplane area 104. The housing 102 also includes a plurality of divider walls 110 and a back wall 112. The housing is preferably made from aluminum or any other suitable electromagnetic wave shielding material.

The back wall 112 includes a plurality of first openings 114 and a plurality of second openings 116. Openings 114 enable access by each of the LRUs 16 to wireless energy that is propagating within the backplane area 104. Openings 116 enable conductors such as wiring harnesses to be coupled to each LRU 16 when the LRU is being supported in the housing 102. An equipment shelf 118 may also be provided for supporting the LRUs 16, and the assembly of the shelf 118 and the LRUs 16 inserted into the housing 102 as a single subassembly. Again, each LRU 16 may include a wireless energy radiating/reception component, such as an antenna or an optical coupling device (not shown), that may protrude through each of the openings 114. It will also be appreciated that an internal divider could be used inside the backplane area 104 to divide this area into two distinct subareas within which wireless energy may propagate and thus form two independent wireless energy channels. Thus, a plurality of independent wireless energy propagation areas may be formed within the housing 102 depending in part upon the number of dividers incorporated within the backplane area 104, and the number and configuration of the openings 114. An optional wireless data concentrator 119 may also be included within the pack plane area 104.

The housing 102 thus forms essentially a faraday cage for containing wireless energy within the backplane area 104. A suitable mesh gasket, possibly a RF mesh gasket 120, may optionally be employed around each of the openings 106 and 108 to prevent stray electromagnetic wave energy from entering into the backplane area 104, as well as for preventing electromagnetic wave energy propagating within the backplane area 104 from radiating out to an ambient environment, and possibly interfering with other adjacently located electronic equipment. If the equipment shelf 118 is included for use, such a shelf would also typically include openings 122 and 124. Openings 122 enable wireless energy to propagate through the shelf 118 and to communicate with its associated LRU 16. Each opening 124 allows an external cable for supplying power and/or data signals to be coupled to each LRU 16.

The system 100 thus also enables wireless communications between each of the LRUs 16 without the need for physical cabling to be employed to interconnect each of the LRUs 16. This also simplifies assembly and removal of the LRUs 16 from the equipment shelf, as well as allowing easier upgrades of LRUs in the event modifications are required.

Referring to FIG. 4, a system 200 in accordance with another alternative embodiment of the present disclosure is shown. System 200 essentially comprises a card file able to hold a plurality of electronic circuit boards within a sealed enclosure so that wireless energy may be freely transmitted between each of the circuit boards. The system 200 includes a box-like card file housing 202 within which each of a plurality of circuit boards 204 are housed. A cover 206 is typically secured over the housing 202 to enclose the circuit boards 204 therein. The housing 202 and cover 206 may be made from any suitable materials, for example aluminum, that impede the ingress and egress of electromagnetic wave signals to/from an interior area 208 of the housing 202.

In the example of FIG. 4, each circuit board 204 may include an RF antenna or optical coupler 210 to facilitate radiating/receiving electromagnetic wave or optical energy to and from the circuit board 204. Thus, various embodiments of the present disclosure can be implemented at the internal circuit card (printed wiring board) level, the LRU (box) level, or the tray and rack (system) level, as well at the overall equipment bay level. Essentially, the various embodiments described herein could be implemented in any application where wireless energy needs to be transmitted between two components, and wherein a faraday-like cage can be formed around the two components.

The various embodiments described herein are readily retrofittable into a variety of existing equipment bays, equipment shelves, and card file components used on various forms of mobile platforms, and particularly on commercial and military aircraft. However, it will be appreciated that such equipment is commonly implemented on a variety of mobile platforms such as aircraft, ships, land vehicles and rotor craft.

Figure 5:
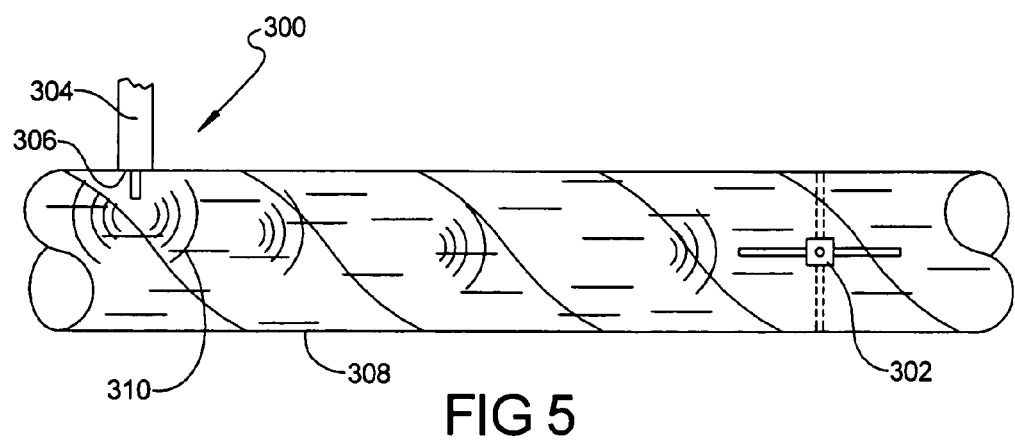
FIG. 5 is a simplified side cross sectional view of a fluid carrying conduit incorporating an electronically actuated component that is controlled by wireless energy transmitted from a wireless energy transmitter interfaced to the conduit.

Referring to FIG. 5, another alternative embodiment of the present disclosure is shown. The embodiment of FIG. 4 illustrates a system 300 for transmitting electromagnetic wave signals within a fluid carrying conductor to control a flow controlling element 302. With this embodiment, this is accomplished by interfacing an electromagnetic wave energy radiating device 304, such as an antenna element, such that a portion of the antenna element 304 protrudes through an opening 306 in a conduit 308 within which the fluid is flowing. Radiating element 306 is used to radiate electromagnetic wave energy 310 to the flow control element 302. The flow control element 302 may comprise a valve, actuator or other form of device for controlling, interrupting or diverting all or a portion of the fluid 310 flowing through the conduit 308, or for controlling some other element such as a flight control aileron on an aircraft. The conduit 308 is preferably a metallic conduit and essentially functions as an electromagnetic waveguide to retain the electromagnetic wave energy propagating therein within the conduit 308. The conduit 308 also functions to prevent stray electromagnetic wave energy from entering the interior area of the conduit. Thus, various forms of flow control devices can be controlled remotely from an antenna element 304 that is interfaced to the conduit 308. It will be appreciated that this embodiment is particularly useful in applications where the routing of external conductors, such as electrical cabling, to the flow control element 302, is difficult and/or impractical because of space, temperature or other constraints. Since the conduit 308 acts as a waveguide, the antenna element 306 does not need to be in the line of sight of the flow control valve 302 to control the valve 302.

The various embodiments thus allow wireless signals to be used within a faraday-cage like structure to enable wireless communication between two or more electronic components. This significantly reduces the weight and complexity of various forms of equipment bays, equipment racks and card files that are often used in various forms of mobile platforms. The present disclosure is readily retrofittable into a wide range of existing equipment bays, equipment shelves, card files, equipment racks, etc. with little or no modifications being required to existing structures. Advantageously, in some embodiments, areas of existing equipment bay structure typically used as cooling airflow channels are also used as electromagnetic wave energy channels, thus requiring little or no modification to the existing structure.

While various embodiments have been described, those skilled in the art will recognize modifications or variations which might be made without departing from the inventive concept. The examples illustrate the disclosure and are not intended to limit it. Therefore, the description and claims should be interpreted liberally with only such limitation as is necessary in view of the pertinent prior art.

What is claimed is:

1. A method for wirelessly communicating electrical signals between at least a plurality of independent electronic components, comprising:
   providing an equipment housing having a plurality of at least three parallel trays for receiving and supporting said pair of independent electronic components, the independent electronic components each forming a removeable and replaceable line replaceable unit (LRU) that is adapted to be linearly inserted and linearly removed from a respective one of the trays;
   forming an open, unobstructed channel in said equipment housing generally orthogonal to said trays and spanning all of the trays, the channel being isolated from wireless energy from an ambient environment in which said equipment housing is located, and for retaining wireless radio frequency or microwave energy flowing inside said channel within said channel;
   disposing each of said LRUs so that each said LRU is supported within a respective one of said trays and such that at least a portion of each said LRU is located adjacent and in communication with said channel;
   substantially sealing an area of interface of each of said LRUs with said channel to insure that wireless radio frequency or microwave energy is only transmitted between said channel and each of said LRUs; and
   using said channel to conduct wireless radio frequency or microwave energy through said channel between said LRUs such that said channel forms an unobstructed area by which any one of the three LRUs can send and receive wireless radio frequency or microwave signals directly to and from any other ones of the LRUs without the need to first reflect the wireless radio frequency or microwave energy from any interior wall portion of the channel.

2. The method of 1, wherein the operation of forming said channel comprises forming an elongated, rectangular channel that functions as a wireless energy backplane for said LRUs.

3. The method of claim 1, wherein substantially sealing said area of interface comprises using a gasket between each of said LRUs and said channel.

4. The method of claim 3, further comprising integrating a wireless energy concentrator into said channel for communicating said wireless radio frequency or microwave energy between a device located outside of said channel and said area within said channel.

5. An apparatus for conducting wireless energy between a plurality of at least three linearly insertable and linearly removable line replaceable units (LRUs) adapted to be housed within said apparatus, said apparatus comprising:
   an enclosure having a plenum for preventing the ingress and egress of wireless energy to and from said enclosure, the enclosure including a plurality of at least three trays for enabling each of said LRUs to be slidably received and removed from one respective tray of the enclosure, with the trays being adjacent to the plenum and the plenum forming an un-partitioned, unobstructed area in communication with each of said LRUs, and the plenum extending perpendicular to said trays to span a distance covered by all of the LRUs, and to enable each said LRU to be able to communicate wireless radio frequency or microwave signals directly to any other one or more of the LRUs without the need to first reflect the wireless radio frequency or microwave signals from an interior surface of the plenum, and the plenum further operating as an unimpeded airflow circulation area by which air is circulated past each of the LRUs to cool the LRUs;
   each of said LRUs including a wireless radio frequency or microwave energy communication subsystem; and
   a cover for enclosing said LRUs within said enclosure and preventing the ingress and egress of wireless radio frequency or microwave signals into and out of an interior area formed by said enclosure and said cover; and wherein said LRUs communicate wirelessly within said enclosure.

6. The apparatus of claim 5, wherein said enclosure comprises a metallic structure.

7. An equipment shelf apparatus for enabling wireless signals to be transmitted between a plurality of three or more linearly insertable and linearly removable line replaceable units (LRUs) being supported by said equipment shelf, said apparatus comprising:
   a housing having a plurality of trays for receiving and supporting the LRUs adjacent to and generally parallel to one another; and
   said housing including a backplane area extending orthogonally relative to the LRUs, the backplane area forming an enclosed, un-partitioned area spanning a distance across all of the LRUs, for enabling wireless radio frequency or microwave energy to propagate within the backplane area directly from any one or more of the LRUs to any other one or more of the LRUs, and without the need to be first reflected from an interior surface of the backplane area;
   said housing further operating to isolate said backplane area from wireless energy propagating outside of said backplane area, and for retaining the wireless radio frequency or microwave energy propagating within said backplane area inside said backplane area;
   the housing adapted to support each of said LRUs so that at least a portion of each of the LRUs is located within one of said trays and adjacent, and in communication with, said backplane area; and
   a gasket for sealing an area of interface of each of said LRUs with said backplane area to insure that the wireless radio frequency or microwave energy is only transmitted between said backplane area and each of said LRUs.

8. The apparatus of claim 7, further comprising a wall including a plurality of first openings for enabling the wireless radio frequency or microwave energy to be communicated between said backplane area and each of said LRUs.

9. The apparatus of claim 8, wherein said wall includes a plurality of second openings for enabling physical coupling between a connector on each of said independent components LRUs and a power connector associated with said housing.

10. The apparatus of claim 7, further comprising a wireless data concentrator disposed within said backplane area for enabling wireless communication between said LRUs and a device located remotely from said equipment shelf apparatus.

11. The apparatus of claim 7, wherein said housing comprises an aluminum housing.

* * * * *